United States Patent
Smick et al.

(10) Patent No.: US 6,423,975 B1
(45) Date of Patent: *Jul. 23, 2002

(54) WAFER HOLDER FOR SIMOX PROCESSING

(75) Inventors: Theodore H. Smick, Essex; Geoffrey Ryding, Manchester; Bernhard F. Cordts, III, Ipswich, all of MA (US); Robert S. Andrews, Kensington, NH (US)

(73) Assignee: Ibis Technology, Inc., Danvers, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/376,505

(22) Filed: Aug. 18, 1999

(51) Int. Cl.[7] ............................. G21K 5/10; H01J 37/30
(52) U.S. Cl. ............................ 250/442.11; 250/492.21
(58) Field of Search ................... 250/492.21, 440.11, 250/442.11, 398

(56) References Cited

U.S. PATENT DOCUMENTS

| | | | |
|---|---|---|---|
| 3,954,191 A | 5/1976 | Wittkower et al. | 214/17 B |
| 4,410,209 A | 10/1983 | Trapani | 294/34 |
| 4,586,743 A | 5/1986 | Edwards et al. | 294/86.4 |
| 4,952,299 A | 8/1990 | Chrisos et al. | 204/298.25 |
| 4,962,049 A | 10/1990 | Chang et al. | 437/13 |
| 5,053,627 A | 10/1991 | Ruffell et al. | 250/492.2 |
| 5,080,730 A | 1/1992 | Wittkower | 148/33 |
| 5,095,300 A | 3/1992 | Alexander et al. | 340/686 |
| 5,096,364 A | 3/1992 | Messer et a. | 414/744.5 |
| 5,196,355 A | 3/1993 | Wittkower | 437/24 |
| 5,288,650 A | 2/1994 | Sandow | 437/24 |
| 5,292,399 A | * 3/1994 | Lee et al. | 156/643 |
| 5,426,558 A | 6/1995 | Sherman | 361/234 |
| 5,436,790 A | 7/1995 | Blake et al. | 361/234 |
| 5,452,177 A | 9/1995 | Frutiger | 361/234 |
| 5,466,945 A | 11/1995 | Brickell | 250/559.12 |
| 5,483,077 A | 1/1996 | Glavish | 250/492.2 |
| 5,483,138 A | 1/1996 | Shmookler et al. | 318/568.16 |
| 5,508,227 A | 4/1996 | Chan et al. | 437/172 |
| 5,611,865 A | 3/1997 | White et al. | 118/725 |
| 5,658,710 A | 8/1997 | Neukermans | 430/320 |
| 5,661,043 A | 8/1997 | Rissman et al. | 438/162 |
| 5,753,923 A | 5/1998 | Mera et al. | 250/443.1 |
| 5,848,889 A | 12/1998 | Tietz et al. | 432/258 |
| 5,854,123 A | 12/1998 | Sato et al. | 438/507 |
| 5,883,016 A | 3/1999 | Chan et al. | 438/798 |
| 5,886,864 A | 3/1999 | Dvorsky | 361/234 |
| 5,891,265 A | 4/1999 | Nakai et al. | 148/33.3 |
| 6,155,436 A | * 12/2000 | Smick et al. | 250/492.21 |

FOREIGN PATENT DOCUMENTS

| | | |
|---|---|---|
| JP | 2236940 | 9/1990 |
| JP | 9063531 | 3/1997 |

* cited by examiner

*Primary Examiner*—Bruce Anderson
(74) *Attorney, Agent, or Firm*—Thomas J. Engellenner; Reza Mollaaghababa; Nutter McClennen & Fish LLP

(57) ABSTRACT

A wafer holder assembly includes first and second main structural members from which first and second wafer-holding arms extend. The first arm is secured to the main structural members by a graphite distal retaining member. The second arm is pivotally biased to a wafer-hold position by a graphite bias member. This arrangement provides a conductive path from the wafer to the assembly for inhibiting electrical discharges from the wafer during the ion implantation process. The assembly can further include additional graphite retaining members for maintaining the structural integrity of the assembly during the extreme conditions associated with SIMOX wafer processing without the need for potentially wafer-contaminating adhesives and conventional fasteners. The wafer-contacting pins at the distal end of the arms can be formed from silicon. The silicon pins can be coated with titanium nitride to enhance electrical contact with the wafer and to provide an abrasion resistant surface. The pins can have a limited profile to minimize the amount of pin material proximate the wafer for reducing the likelihood of electrical arcing from the wafer to the pin.

27 Claims, 11 Drawing Sheets

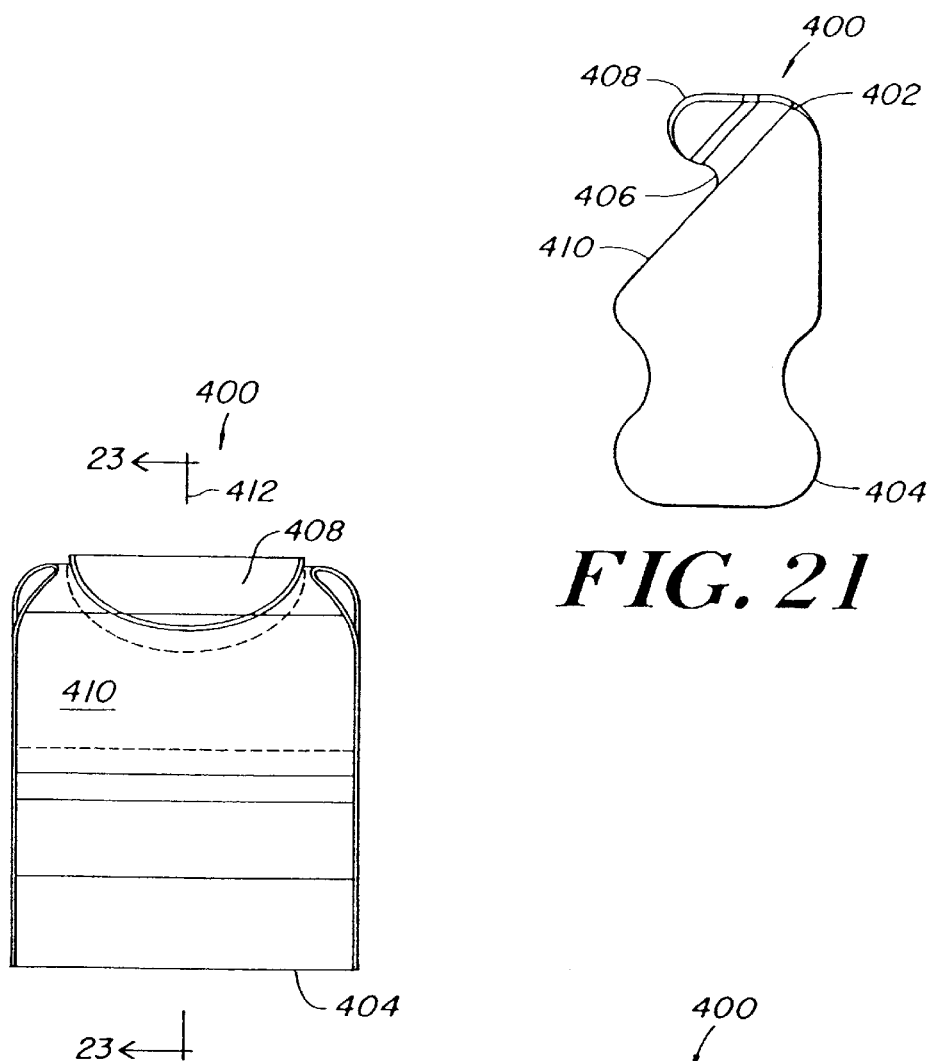
FIG. 21
FIG. 22
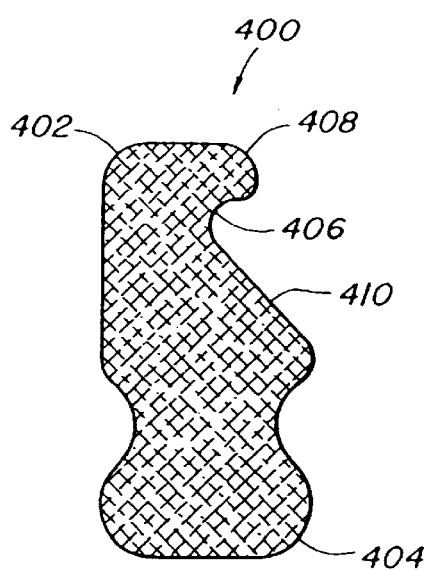
FIG. 23

WAFER HOLDER FOR SIMOX PROCESSING

BACKGROUND OF THE INVENTION

The present invention relates generally to silicon wafer processing, and more particularly, to devices for holding silicon wafers as they are subjected to ion bombardment and to heat treatment.

Various techniques are known for processing silicon wafers to form devices, such as integrated circuits. One technique includes implanting oxygen ions into a silicon wafer to form buried layer devices known as silicon-on-insulator (SOI) devices. In these devices, a buried insulation layer is formed beneath a thin surface silicon film. These devices have a number of potential advantages over conventional silicon devices (e.g., higher speed performance, higher temperature performance and increased radiation hardness). The lesser volume of electrically active semiconductor material in SOI devices, as compared with bulk silicon devices, tends to reduce parasitic effects such as leakage capacitance, resistance, and radiation sensitivity.

In one known technique, known by the acronym SIMOX, a thin layer of a monocrystalline silicon substrate is separated from the bulk of the substrate by implanting oxygen ions into the substrate to form a buried dielectric layer. This technique of "separation by implanted oxygen" (SIMOX), provides a heterostructure in which a buried silicon dioxide layer serves as a highly effective insulator for surface layer electronic devices.

In the SIMOX process, oxygen ions are implanted into silicon, after which the material is annealed to form the buried silicon dioxide layer or BOX region. The annealing phase redistributes the oxygen ions such that the silicon/silicon dioxide boundaries become more abrupt, thus forming a sharp and well-defined BOX region, and heals damage in the surface silicon layer caused by the ion bombardment.

During the SIMOX process, the wafers are subjected to relatively severe conditions. For example, the wafers are typically heated to temperatures of about 500–600 degrees Celsius during the ion implantation process. Subsequent annealing temperatures are typically greater then 1000 degrees Celsius. In contrast, most conventional ion implantation techniques do not tolerate temperatures greater than 100 degrees Celsius. In addition, the implanted ion dose for SIMOX wafers is in the order of $1 \times 10^{18}$ ions per square centimeter, which can be two or three orders of magnitude greater than some known techniques.

Conventional wafer holding devices are often incapable of withstanding the relatively high temperatures associated with SIMOX processing. Furthermore, wafer-holding structures having exposed metal are ill-suited for SIMOX processes because the ion beam will induce sputtering of the metal and, thus, result in wafer contamination. In addition, the structure may deform asymmetrically due to thermal expansion, which can damage the wafer surface and/or edge during high temperature annealing so as to compromise wafer integrity and render it unusable.

Another disadvantage associated with certain known wafer holders is electrical discharge of the wafers. If a wafer holder is formed from electrically insulative materials, the wafer will become charged as it is exposed to the ion beam. The charge build up disrupts the implantation process by stripping the ion beam of space charge neutralizing electrons. The charge built-up on the wafer can also result in a discharge to a nearby structure via an electrical arc, which can also contaminate the wafer or otherwise damage it.

It would, therefore, be desirable to provide a wafer holder that is electrically conductive and is able to withstand the relatively high temperatures and energy levels associated with SIMOX wafer processing while also minimizing the potential for sputter contamination.

SUMMARY OF THE INVENTION

The present invention provides a wafer holder assembly that maintains its structural integrity and prevents the build up of electrical charge on the wafer during the ion implantation process. Although the invention is primarily shown and described in conjunction with SIMOX wafer processing, it is understood that the wafer holder assembly has other applications relating to implanting ions into a substrate and to wafer processing in general.

In one aspect of the invention, a wafer holder assembly includes a-structural member that can be mechanically coupled to a target stage within an implanter system. The structural member serves as a base for the wafer holding members and, in one embodiment, can be formed by first and second main structural rails, generally parallel and spaced at a predetermined distance. A first wafer-holding arm rotatably extends from distal ends of the main structural members. In one embodiment, the first arm includes a transverse member having first and second portions, each of which includes a distal tip for releasably engaging a respective wafer-contacting pin. The transverse member is rotatable such that the wafer-contacting pins, which are spaced apart on the wafer edge, apply substantially equal pressure to the wafer.

A second wafer-holding arm extends from a proximal region of the assembly for providing a third contact point on the wafer via a wafer-contacting pin. The second arm pivots about an axis defined by a bearing connected to at least one main structural member to facilitate loading and unloading of the wafer from the assembly. In one embodiment, a bias member biases the second arm towards a wafer-hold position.

In another aspect of the invention, the wafer holder assembly is secured together by a series of retaining members to eliminate the need for conventional fasteners and adhesives, which are associated with wafer contamination. In one embodiment, a distal retainer member includes a first end engageable with the first arm and a second end matable to the main structural members with a spring member extending between the first and second ends. The distal retainer member is held under tension by the spring member so as to secure the first arm to the main structural members while allowing the transverse member to freely rotate about the first axis such that the first and second pins apply equal pressure to the wafer.

An intermediate retainer member can be coupled to the main structural members in an intermediate region of the assembly. In one embodiment, the intermediate retainer member can include first and second opposed U-shaped outer members with a spring member extending therebetween. The spring member is under tension such that the outer members remain engaged with corresponding protrusions on the bottom of the main structural members. The intermediate retaining member maintains the spacing of the first and second main structural members and enhances the overall mechanical strength of the assembly.

The assembly can further include a proximal retainer member disposed in the proximal region of the assembly. The proximal retainer member includes upper and lower members coupled by a proximal spring member. The upper and lower members are engaged to the main structural members by the spring member, which is under tension.

In a further aspect of the invention, the wafer holder assembly provides a conductive path from the wafer to the assembly, which can be coupled to ground. By grounding the wafer, the build up of electrical charge on the wafer is inhibited for preventing potentially damaging electrical arcing from the wafer during the ion implantation process. In an exemplary embodiment, the main structural members, the first and second arms, the bias member, and the retainer members are formed from graphite and the wafer-contacting pins are formed from silicon. These materials provide the necessary rigidity and electrical conductivity for the wafer holder assembly to achieve optimal SIMOX wafer processing conditions. In addition, the likelihood of wafer contamination is reduced since only silicon contacts the silicon wafer and only silicon meets the ion beam, thereby minimizing wafer contamination and particle generation. Further, the graphite bias members have a substantially invariant spring constant over a wide temperature range, such as from room temperature to about 600° C. The assembly can, therefore, be substantially calibrated at room temperature.

In yet another aspect of the invention, the wafer-contacting pins have a geometry that is effective to reduce the likelihood of electrical discharges from the wafer. In one embodiment, the pins have a proximal portion for coupling to a distal end of the wafer-holding arms and a distal portion for holding the wafer. In one embodiment, the distal portions have an arcuate wafer-receiving neck disposed between a wedge-shaped upper region and a tapered surface. The geometry of the pin upper region reduces the amount of pin material proximate the wafer so as to reduce the likelihood of electrical arcing between the wafer and the pin during the ion implantation.

In another aspect of the invention, the wafer-contacting pins are coated with a relative hard, conductive material, such as titanium nitride (TiN) or titanium aluminum nitride (TiAlN). The coating provides a durable, abrasion resistant surface for contacting the wafer. In addition, the TiN coating is more conductive than silicon, from which the pin is formed, to enhance electrical contact between the wafer and the pin thereby increasing the amount of current, i.e., charge build up, flowing from the wafer. The TiN coating also prevents so-called wafer-bonding between the wafer and the pin.

BRIEF DESCRIPTION OF THE DRAWINGS

The invention will be more fully understood from the following detailed description taken in conjunction with the accompanying drawings, in which:

FIG. 21 is a side view of the wafer-contacting pin of FIG. 18;

FIG. 22 is a front view of the wafer-contacting pin of FIG. 18; and

FIG. 23 is a cross-sectional view of the wafer-contacting pin of FIG. 20 along line 23—23.

DETAILED DESCRIPTION

The present invention provides a wafer holder assembly that is well-suited for SIMOX wafer processing, which includes the use of relatively high ion beam energies and temperatures. In general, the wafer holder assembly has a structure that maintains its integrity and reduces the likelihood of wafer contamination during extreme conditions associated with SIMOX wafer processing. The wafer holder assembly can be formed from electrically conductive materials to provide an electrical path from the wafer to ground for preventing electrical charging of the wafer, and possible arcing, during the ion implantation process.

Figure 1:
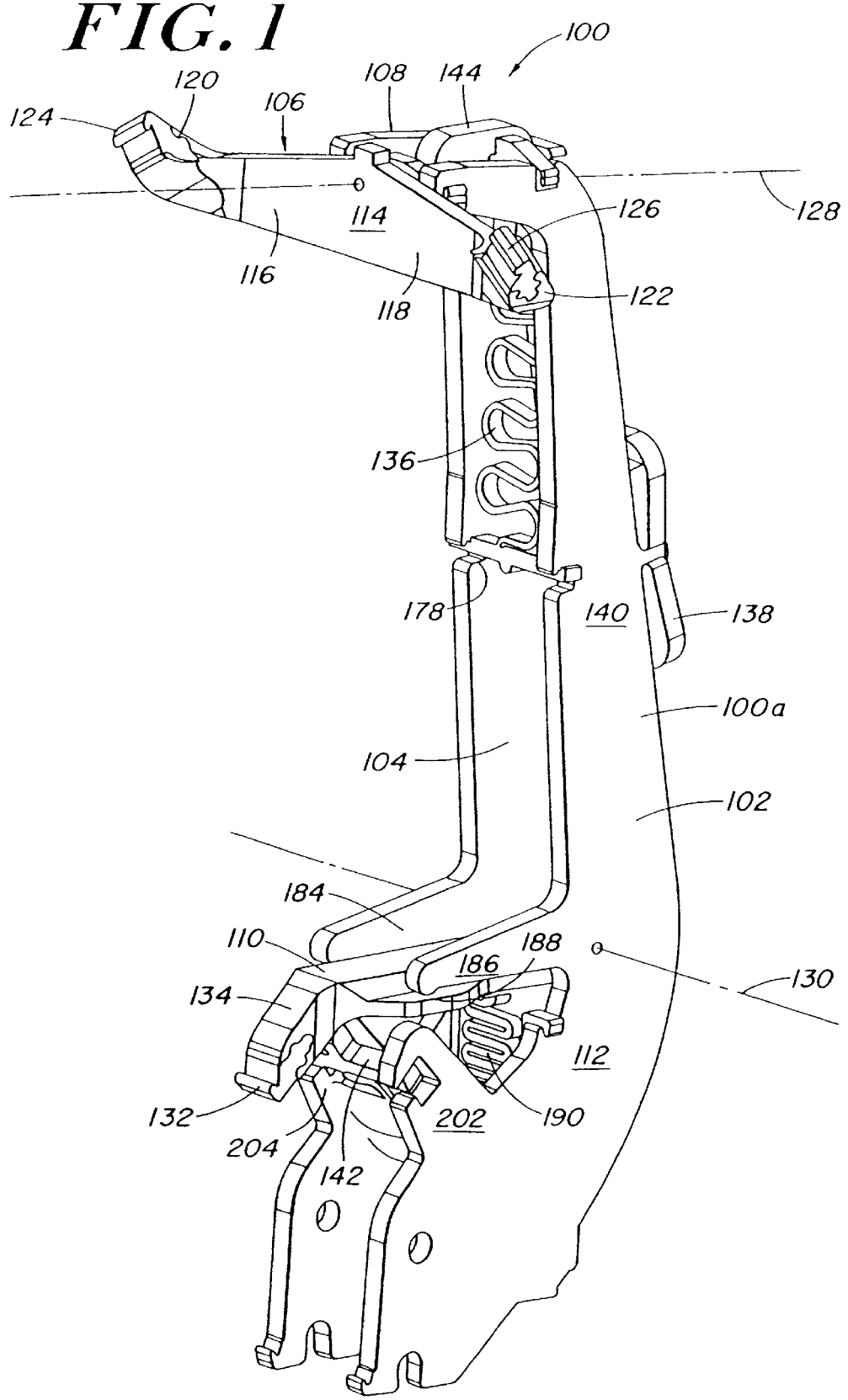
FIG. 1 is a perspective view of a wafer holder assembly in accordance with the present invention.
Figure 2:
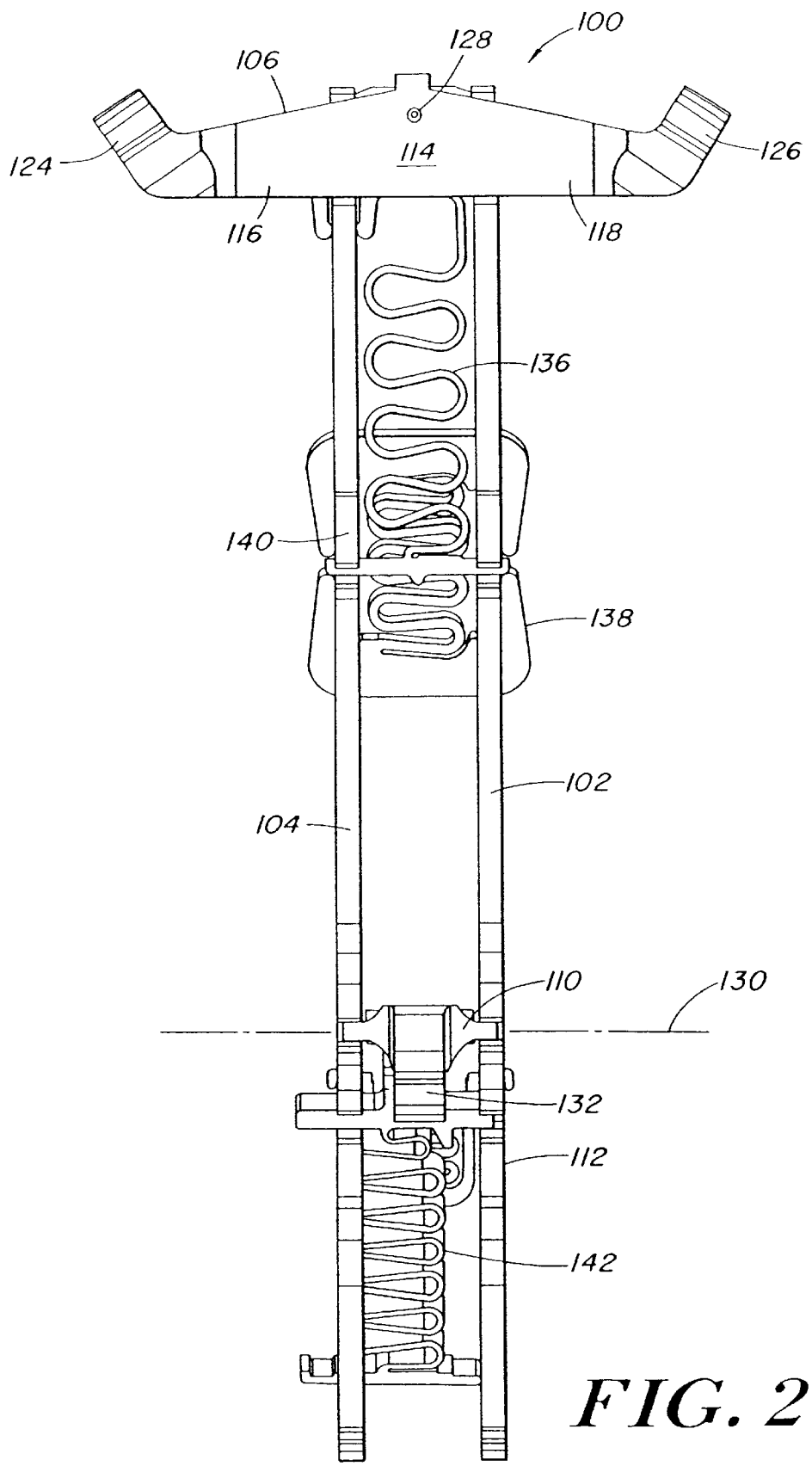
FIG. 2 is a front view of the wafer holder assembly of FIG. 1.

FIGS. 1–2 show a wafer holder assembly 100 in accordance with the present invention. The assembly includes first and second main structural rail members 102,104 that are substantially parallel to each other and spaced apart at a predetermined distance. In the exemplary embodiment shown, the main structural members 102,104 are generally C-shaped. A first wafer-holding arm 106 is rotatably secured to a distal end 108 of the holder assembly and a second wafer-holding arm 110 is pivotably secured to the assembly at a generally proximal region 112 of the assembly.

The first arm 106 includes a transverse member 114 having first and second portions 116,118 each of which terminates in a respective distal end 120,122. Wafer-contacting pins 124,126 are secured to the distal ends 120,122 of the first and second arm portions. The first arm 106 is rotatable about a first axis 128 that is generally parallel to the first and second main structural members 102,104. By allowing the first arm 106 to rotate about the first axis 128, the first and second arm portions apply substantially equal pressure to the wafer edge via the spaced apart wafer-contacting pins 124,126.

The second arm 110 is pivotable about a second axis 130 that is generally perpendicular to the main structural members 102,104 to facilitate loading and unloading of the wafers. A wafer-contacting pin 132 is affixed to the distal end 134 of the second arm to provide, in combination with the pins 124,126 coupled to the first arm, three spaced apart contact points to securely hold the wafer in place.

Typically, placement of the pins about the circumference of the wafer is limited by a notch or "significant flat" in the wafer that is used for orientating the wafer on the holder assembly. Some processing techniques include rotating the wafer a quarter turn, for example, one or more times during the implantation process to ensure uniform doping levels.

The wafer holder assembly can further include a series of retaining members for securing the components of the assembly together without the need for conventional fasteners and/or adhesives. It is understood that adhesives can vaporize or outgas during the ion implantation process and contaminate the wafer. Similarly, conventional fasteners, such as exposed metal screws, nuts, bolts, and rivets can also contaminate the wafer. In addition, such devices may have incompatible thermal coefficients of expansion making the assembly prone to catastrophic failure.

In one embodiment, the assembly includes a distal retaining member 136 coupling the first arm 106 to the assembly and an intermediate retaining member 138 affixed to a bottom of the assembly to maintain the spacing of the first and second main structural members 102,104 in a middle region 140 of the assembly. The assembly can further include a proximal retaining member 142 securing the structural members in position at the proximal region 112 of the assembly.

Figure 3:
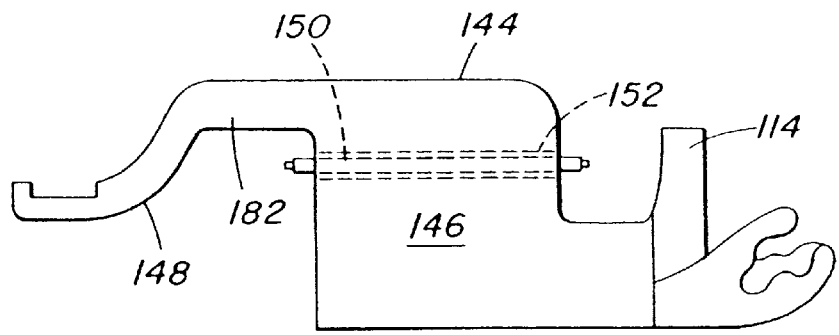
FIG. 3 is a side view of a first arm that forms a part of the wafer holder assembly of FIG. 1.
Figure 4:
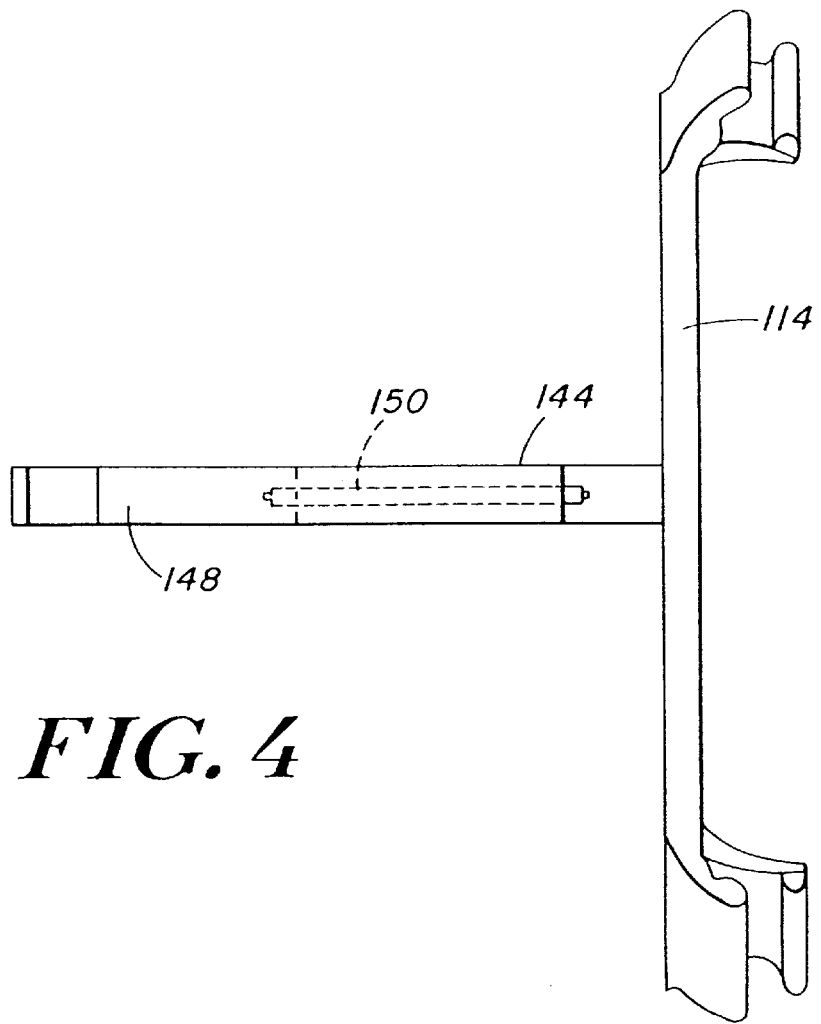
FIG. 4. is a top view of the first arm assembly of FIG. 3.

FIGS. 3–7 (shown without the wafer-contacting pins), in combination with FIGS. 1 and 2, show further details of the wafer holder assembly structure. The first arm 106 includes a support member 144 extending perpendicularly from the transverse member 114 (FIGS. 3–4). The support member 144 includes an intermediate region 146 and an arcuate coupling member 148. A bearing number 150 extends through a longitudinal bore 152 in the intermediate region 146 of the support member 144 (FIGS. 3–4).

Figure 5:
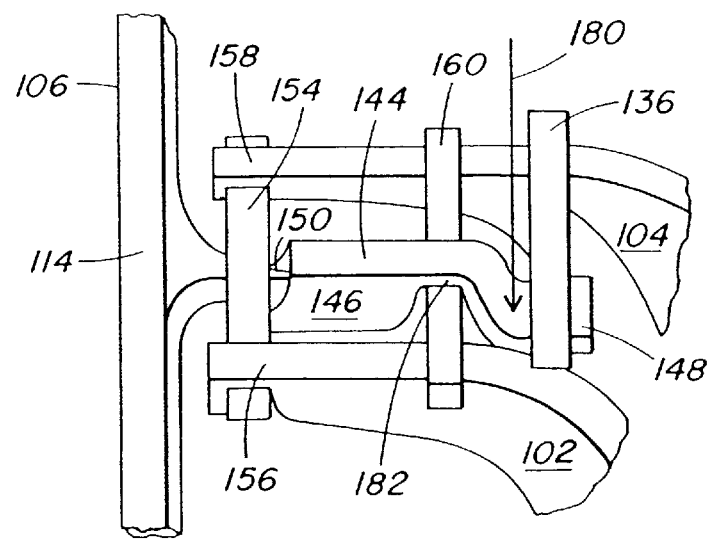
FIG. 5 is a perspective view of a distal region of the wafer holder assembly of FIG. 1.
Figure 6:
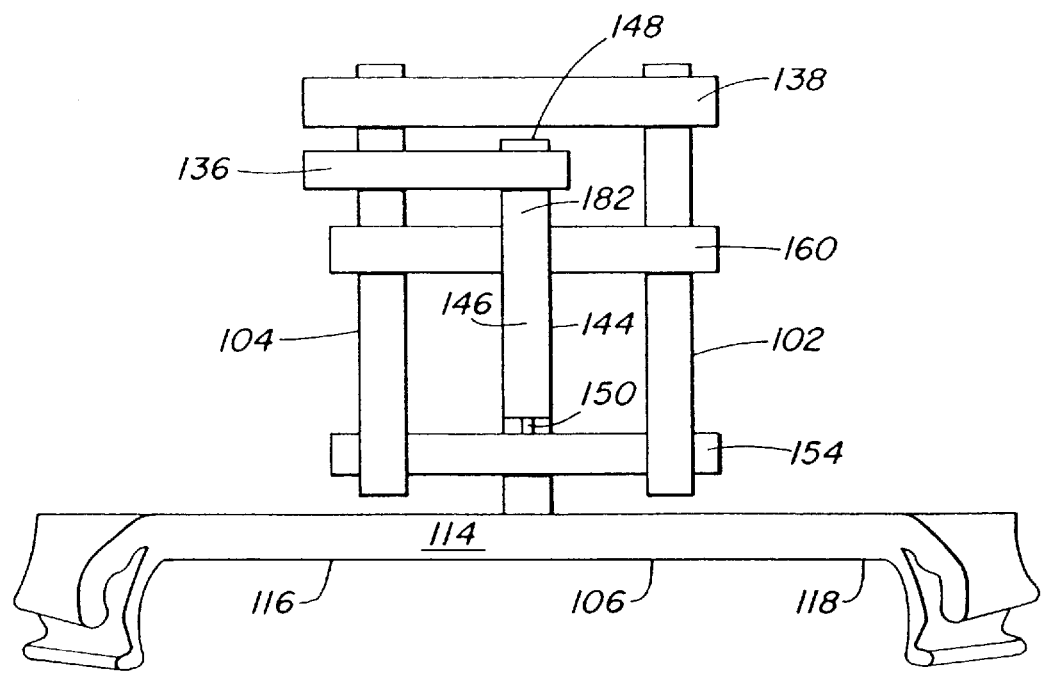
FIG. 6 is a top view of the distal region of FIG. 5.
Figure 7:
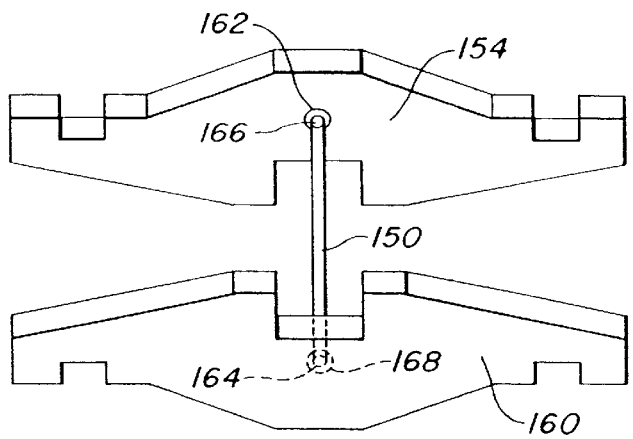
FIG. 7 is a perspective view of first and second cross members that are engageable with the first arm assembly of FIG. 3.

A first cross member 154 is matable with the distal ends 156,158 of the main structural members 102,104 and a second cross member 160 is matable to the main structural members at a predetermined distance from the first cross member 154 (FIGS. 5–6). The first and second cross members 154,160 are adapted for mating with opposite edges of the main structural members 102,104. It is understood that notches can be formed in the various components to receive mating components. Each of the first and second cross members 154,160 includes a respective bore 162,164 for receiving an end of the bearing member 150. (FIG. 7). In one embodiment, the bearing member is a rod having each end seated within respective sleeve members 166,168 disposed within an aperture in the cross members 154,160. The sleeve members 166,168 allow the first arm 106 to freely rotate while minimizing particle generation due to graphite on graphite contact during rotation of the first arm. In one embodiment, the sleeves are formed from a hard, insulative material, such as aluminum oxide (sapphire).

Figure 8:
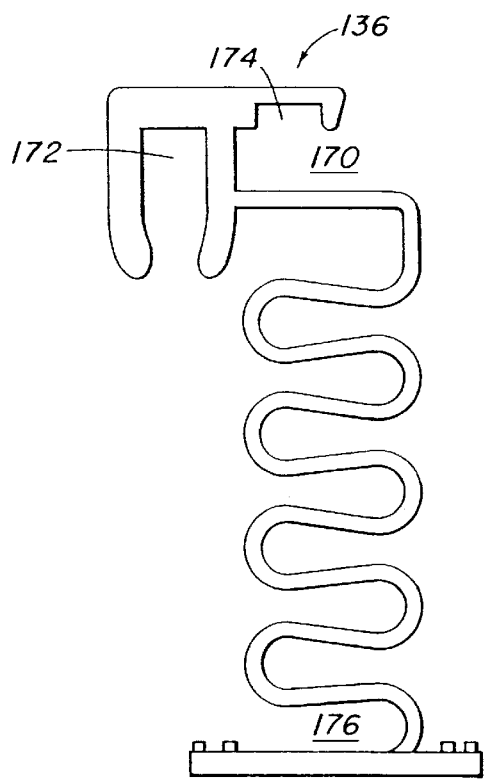
FIG. 8 is a side view of a distal retaining member that forms a part of the wafer holder assembly of FIG. 1.

FIG. 8, in combination with FIGS. 1 and 2, show further details of the distal retaining member 136 having a first end 170 with a first notch 172 for coupling to one of the main structural members 102 and a second notch 174 for engaging the coupling member 148 (FIG. 3) of the first arm. A second end 176 of the distal retaining member 136 is matable to the intermediate region 140 of the assembly. Indents 178 can be formed in the main structural members 102,104 to facilitate engagement of the second end 176 to the assembly (FIG. 1).

Figure 9:
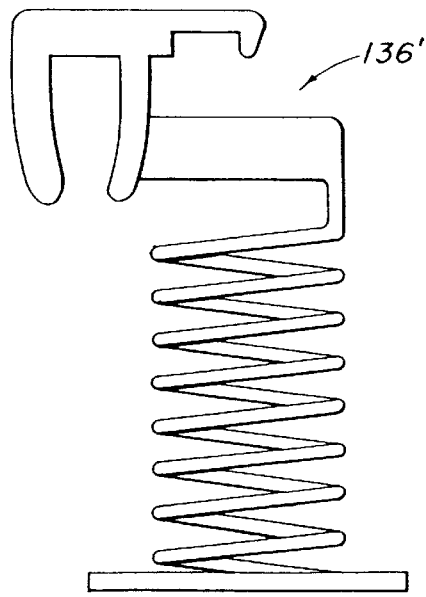
FIG. 9 is a side view of an alternative embodiment of the distal retaining member of FIG. 8.
Figure 10:
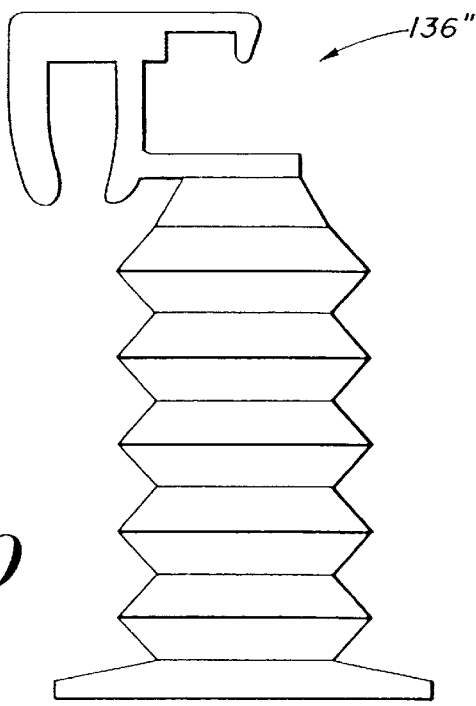
FIG. 10 is a side view of a further alternative embodiment of the distal retaining member of FIG. 8.

FIGS. 9–10 show alternative embodiments of the distal retaining member in the form of a helical spring 136' and a bellows 136", respectively. It is understood that one of ordinary skill in the art can readily modify the geometry of the retaining members.

In one embodiment, the distal retaining member 136 is under tension so as to apply a force having a direction indicated by arrow 180 (FIG. 5) on the coupling member 148 of the support member. The force applied by the distal retaining member 136 pressures a neck 182 (FIG. 3) of the support member against the second cross member 160. The applied force also pressures the first cross member 154, via the bearing member 150, against the main structural members 102,104 as the second cross member 160 functions as a fulcrum for the support member 144. However, the transverse portion 114, as well as the support member 144 of the first arm, freely rotate about the first axis 128, i.e., the bearing member 150, such that the pins 124,126 at the distal ends of the first arm portions 116,118 provide substantially equal pressure on the wafer.

Figure 11:
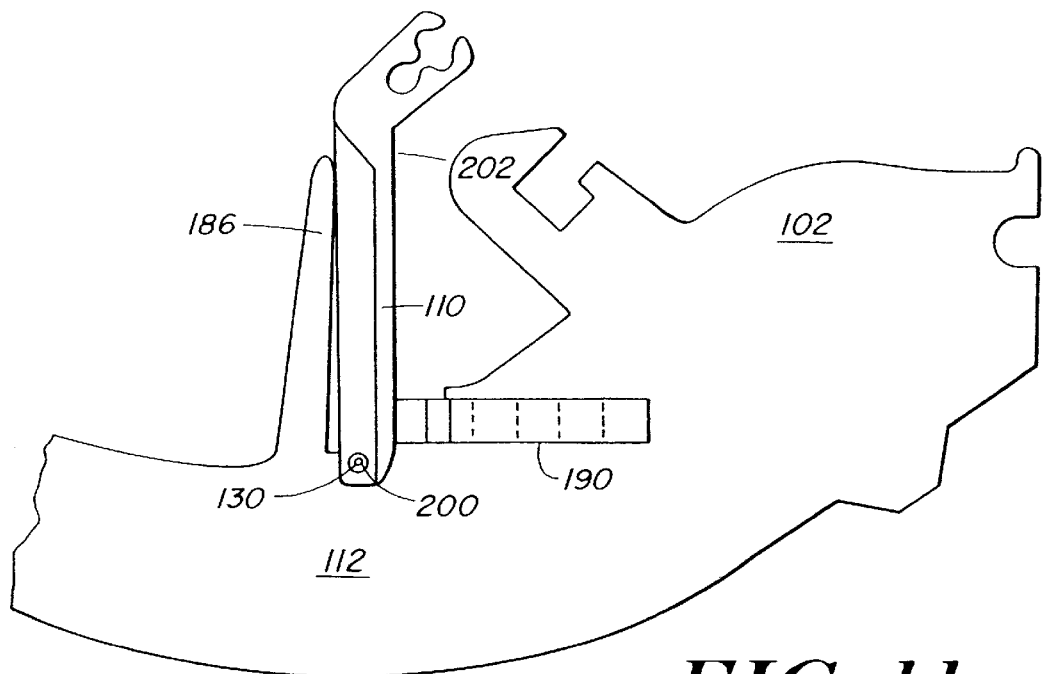
FIG. 11 is a partial side view of a proximal portion of the wafer holder assembly of FIG. 1.
Figure 12:
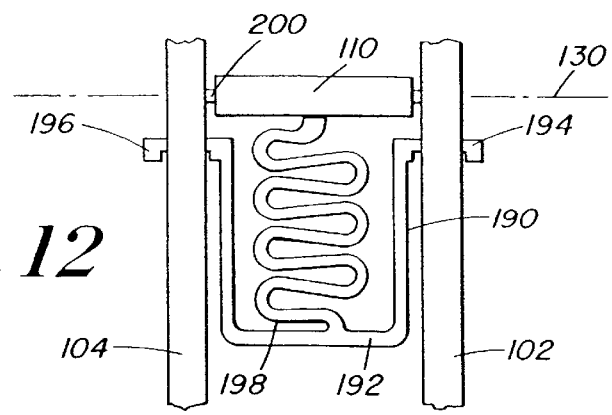
FIG. 12 is a bottom view of a proximal portion of the wafer holder assembly of FIG. 1.

FIGS. 11 and 12 (bottom view), in combination with FIGS. 1 and 2, show further details of the second proximal region 112 of the wafer holder assembly 100. FIG. 11 is shown without the second main structural member 104 for clarity. First and second stop members 184 (FIG. 1), 186 extend from the main structural members 102,104. In an exemplary embodiment, the second arm 110 includes wing regions 188 (FIG. 1) that are biased against the ends of the stop members 184,186 by a bias member 190. In one embodiment, the bias member 190 is under compression so as to pressure the second arm 110 against the stop members 184,186, e.g., the wafer-hold position. The bias member 190 includes a U-shaped outer portion 192 having a first end 194 mated to the first structural member 102 and a second end 196 coupled to the second structural member 104 (FIG. 12). A spring portion 198 of the second bias member includes one end abutting the second arm member 110 and the other end extending from a bottom of the U-shaped outer member 192.

The second arm 110 pivots at its bottom end about a second bearing member 200 disposed on the second axis 130, which is generally perpendicular to the main structural members 102,104. The second bearing member 200 extends through a bore in the second arm with each end of the bearing member being seated in a sleeve inserted within a respective main structural member 102,104. Rotation of the second arm 110 is limited by respective brace members 202,204 extending from the main structural members 102, 104.

Figure 13:
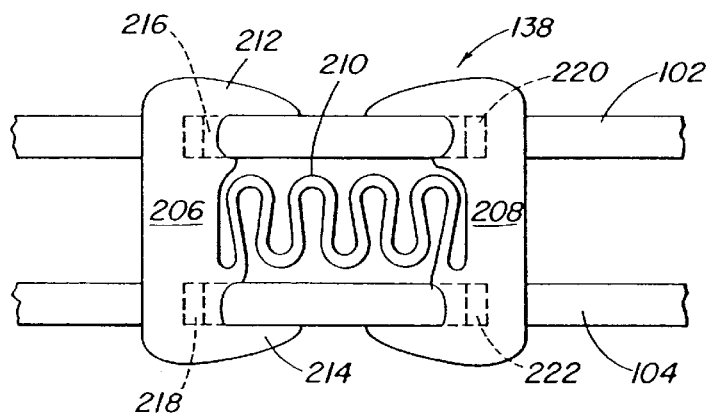
FIG. 13 is a bottom view of an intermediate retaining member that forms a part of the wafer holder assembly of FIG. 1.

FIG. 13 (bottom view), in combination with FIGS. 1 and 2, shows further details of the intermediate retaining member 138, which is mated to the main structural members 102,104 in the intermediate region 140 of the assembly. The intermediate retaining member 138 includes first and second opposing U-shaped outer members 206,208 with a spring member 210 extending therebetween. The first outer member 206 has first and second arms 212,214 for mating engagement with corresponding notched protrusions 216, 218 formed on the bottom of the main structural members 102,104. Similarly, the second outer member 208 includes arms that are matable with notched protrusions 220,222. In one embodiment, the U-shaped outer members 206,208 are forced apart to facilitate mating to the protrusions. Upon proper positioning, the outer members 206,208 are released such that spring member 210 biases the outer members against the protrusions. The intermediate retaining member 138 is effective to maintain the spacing between the first and second main structural members 102,104 and enhance the overall mechanical strength of the assembly.

Figure 14:
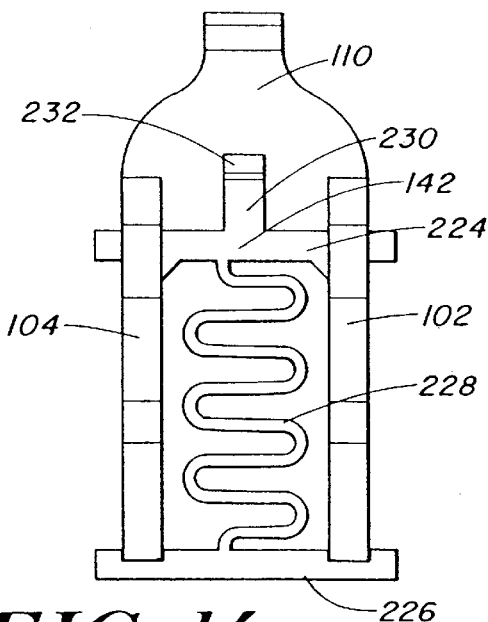
FIG. 14 is a partial side view of a proximal retaining member that forms a part of the wafer holder assembly of FIG. 1.

FIG. 14 shows the proximal retaining member 142, which provides structural rigidity in the proximal region 112 of the wafer holder assembly. In one embodiment, the proximal retaining member 142 includes upper and lower members 224,226 coupled by a spring member 228. The spring member 228 can be engaged to the main structural members such that the spring member is under tension. The proximal retaining member 142 can include a protruding member 230 having a slot 232 formed therein.

Figure 15:
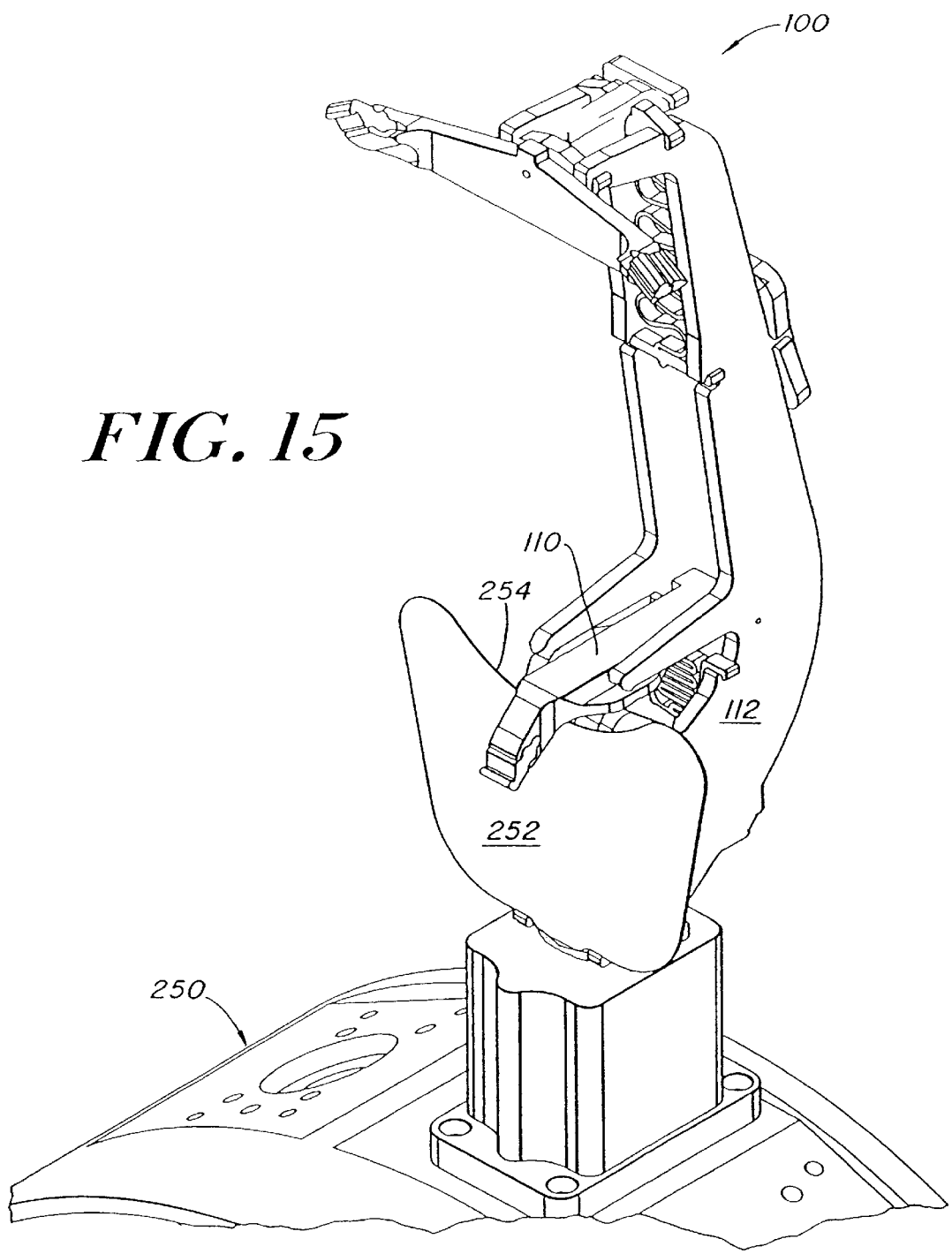
FIG. 15 is a perspective view of a further embodiment of a wafer holder assembly in accordance with the present invention.

As shown in FIG. 15, the assembly 100 is matable with a rotatable hub assembly 250 to which a series of wafer holder assemblies can be secured. A shield 252 can be secured to the proximal region 112 of the assembly to protect exposed regions of the assembly from beam strike. The shield 252 prevents sputtering from the assembly components, as well as any metal devices used to affix the assembly to the hub 250, during the ion implantation process. In addition, the assembly components are not heated by direct exposure to the ion beam. In one embodiment, an edge of the shield 252 is captured in the slot 232 (FIG. 14) located in the proximal retaining member 142.

It is understood that the shield 252 can have a variety of geometries that are effective to shield the assembly components from beam strike. In one embodiment, the shield 252 is substantially flat with an arcuate edge 254 proximate the second wafer-holding arm 110 to increase the shielded region of the assembly.

It is further understood that the shield can be formed from various materials that are suitably rigid and are opaque to the ion beam. One exemplary material is silicon having properties that are similar to a silicon wafer.

The wafer-contacting pins 124,126,132 coupled to ends of the wafer-holding arms are adapted for contacting and securing the wafer in the wafer holder assembly 100. In general, the pins should apply sufficient pressure to maintain the wafers in the holder assembly during the load and unload process in which the wafers are manipulated through a range of motion that can include a vertical orientation. However, undue pressure on the wafers should be avoided since damage to the wafer surface and/or edge can result in the formation of a slip line during the subsequent high temperature annealing process. In addition, the wafer-contacting pins should not electrically insulate the wafer from the assembly. Further, the pins should be formed from a material that minimizes contamination of the wafer.

Figure 16A:
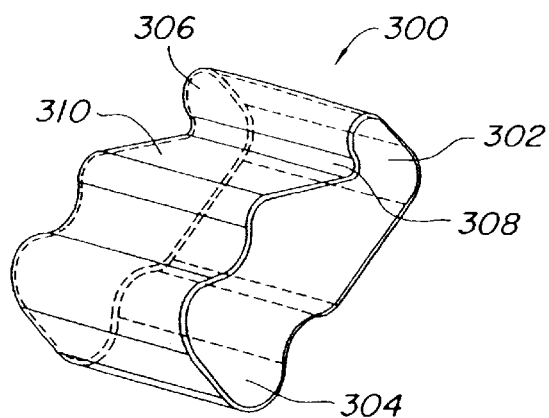
FIG. 16A is a perspective view of a wafer-contacting pin that forms a part of the wafer holder assembly of FIG. 1.
Figure 16B:
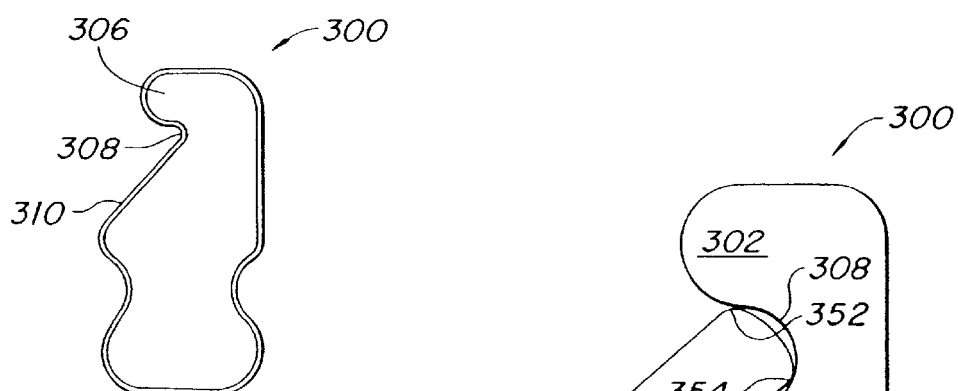
FIG. 16B is a side view of the wafer-contacting pin of FIG. 15.

FIGS. 16A–B show a wafer-contacting pin 300 adapted for use with a wafer holder assembly in accordance with the present invention. The pin has a distal portion 302 having a geometry adapted for holding the edge of a wafer and a proximal portion 304 having a contour complementing a corresponding channel formed in the ends of the wafer arms 106,110 (FIG. 1). It is understood that a variety of shapes and surface features can be used to securely and releasably mate the pin 300 to the wafer-holding arms.

Figure 17:
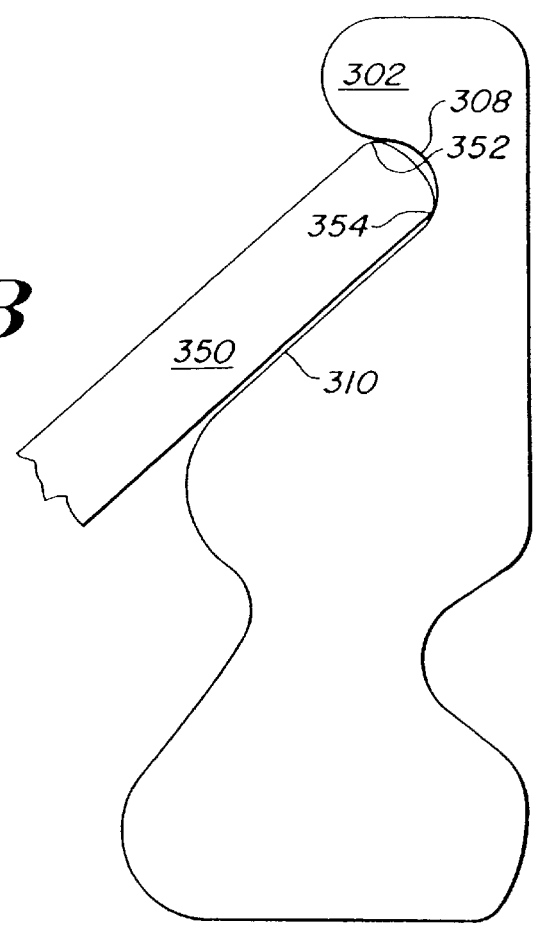
FIG. 17 is a side view of the wafer-contacting pin of FIG. 15 shown holding a wafer.

The distal portion 302 of the pin includes a ridge 306 extending from an arcuate wafer-receiving groove 308 in the pin. A tapered surface 310 extends proximally from the groove 308. As shown in FIG. 17, the pin should contact the top 352 and bottom 354 of the wafer 350 to prevent movement and/or vibration of the wafer as the holder assembly is rotated during the implantation process. In addition, the tapered surface 310 provides a ramp on which the wafer edge may first contact and slide upon during the wafer load process until meeting the ridge 306.

FIGS. 18–23 show a wafer-contacting pin 400 in accordance with the present invention having a more limited profile. The pin 400 includes a distal portion 402 for holding a wafer and a proximal portion 404 for coupling to the arm ends. The distal portion 402 of the pin is rounded to minimize the amount of pin material proximate the wafer edge for reducing the likelihood of electrical discharge from the wafer to the pin. In addition, the pin geometry is optimized to maximize the distance between the wafer edge and the pin except at the wafer/pin contact interface. Further, the wafer-contacting region of the pin 400 should be smooth to minimize the electric field generated by a potential difference between the wafer and the pin. The pin should also minimize the wafer/pin contact area.

The distal portion 402 of the pin includes a wafer-receiving groove or neck 406 disposed between a wedge-shaped upper region 408 and a tapered surface 410. The neck 406 can be arcuate to minimize the contact area between the wafer edge and the pin. The upper region 408, including the neck 406, can taper to a point or edge 412 for reducing the amount of pin material near the wafer edge to inhibit electrical arcing between the wafer and the pin.

It is understood that the term wedge-shaped should be construed broadly to include a variety of geometries for the pin upper region. In general, the wedge-shaped upper region broadens from a point nearest a center of a wafer held in the assembly. Exemplary geometries include triangular, arcuate, and polygonal.

Figure 18:
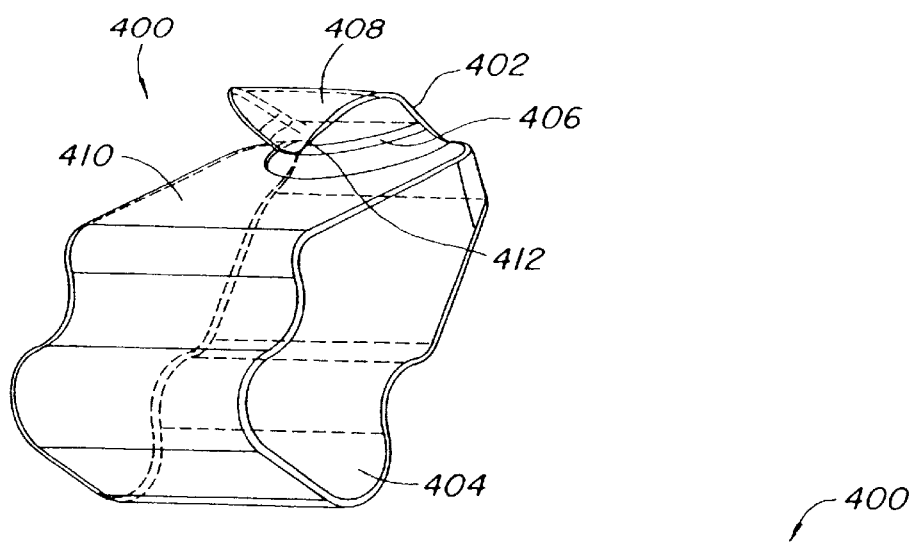
FIG. 18 is a perspective view of a wafer-contacting pin in accordance with the present invention.
Figure 19:
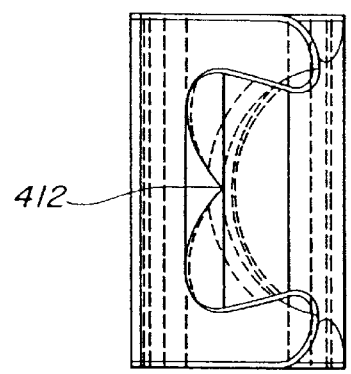
FIG. 19 is a top view of the wafer-contacting pin of FIG. 18.
Figure 20:
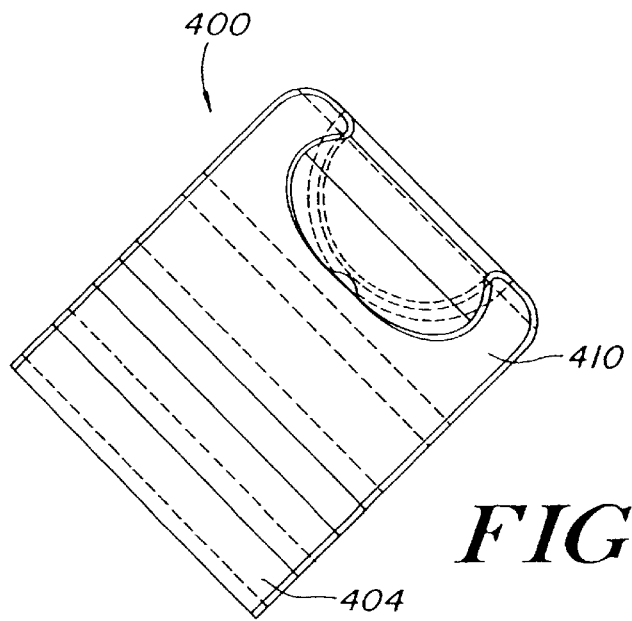
FIG. 20 is an angled view of the wafer-contacting pin of FIG. 18

In a further aspect of the invention, a wafer-contacting pin, such as one of the pins 122,300,400 shown in FIGS. 1, 15, 18, is coated with a relatively hard, electrically conductive film, such as titanium nitride (TiN) or titanium aluminum nitride (TiAlN). The coating provides a relatively hard, abrasion resistant material that enhances the ruggedness of the pin. In the case where the pin is formed from silicon, the TiN coating, for example, is more conductive than the silicon pin such that the likelihood of electrical arcing is reduced in comparison with an uncoated pin. In addition, the coating inhibits so-called wafer bonding in which two silicon surfaces tend to stick together during extreme processing conditions, e.g., relatively high temperatures. It is understood that potentially contaminating particles can be generated when a wafer bond between a wafer and a wafer-contacting pin is broken.

The coating can be applied to the pin using a variety of techniques including chemical vapor deposition and reactive sputtering. For chemical vapor deposition to provide a TiN coating, an exemplary precursor gas is titanium chloride. For reactive sputtering a titanium target can be used and nitrogen gas can be added to an argon gas environment.

It is understood that the TiN or TiAlN coating can be applied to cover the entire pin, as well as only targeted portions corresponding to the pin/wafer interface. It is further understood that the TiN coating can be applied in discrete portions or as a continuous coating.

The thickness of the coating can vary from about 0.1 micrometers to about 10.0 micrometers, and more preferably from about 2 micrometers to about 5 micrometers. A preferred coating thickness is about 5 micrometers.

In a further aspect of the invention, the materials for the various components are selected to provide desired features of the assembly, e.g., mechanical durability; electrical conductivity; and minimal particulation. Exemplary materials for the wafer-contacting pin include silicon and graphite. It is understood that silicon is conductive in its intrinsic state at elevated temperatures. Exemplary materials for the main structural members, the retainer members, and the bias member include silicon carbide, graphite and vitreous or vacuum impregnated graphite, which can be coated with titanium carbide. The graphite retainer and bias members can be fabricated from graphite sheets using wire electron discharge machine ("wire EDM"), laser machining and conventional cutting techniques.

The graphite bias and retaining members maintain a steady, i.e., invariant, spring constant over a wide range of temperatures. This allows the wafer holder assembly to be adjusted at room temperature for operation at temperatures of 600° C. and higher, which can occur during the ion implantation process. The graphite components also provide a conductive pathway for grounding the wafer, even where insulative sleeves for the bearing members are used.

The wafer holder assembly of the present invention provides a structure that withstands the relatively high temperatures and ion beam energies associated with SIMOX wafer processing. In addition, the likelihood of wafer contamination is reduced since the ion beam strikes only silicon thereby minimizing carbon contamination and particle production. Furthermore, the likelihood of the electrical discharge from the wafer is minimized due to the selection of conductive materials/coatings for the assembly components and/or the geometry of the wafer-contacting pins.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A wafer holder assembly, comprising:
   at least one main structural member;
   a first arm joined to the at least one main structural member; and
   a second arm pivotably coupled to the at least one main structural member, the second arm being biased towards a wafer-holding position by a bias member,
   wherein the wafer holder assembly provides a conductive path from a wafer to the wafer holder assembly to inhibit electrical charging of a wafer as the wafer is subjected to an ion beam.

2. The assembly according to claim 1, wherein the at least one main structural member is formed from graphite.

3. The assembly according to claim 1, wherein the first and second arms are formed from graphite.

4. The assembly according to claim 1, wherein the bias member is formed from graphite.

5. The assembly according to claim 1, wherein the first arm is joined to the at least one main structural member by a conductive distal retaining member.

6. The assembly according to claim 5, wherein the distal retaining member is under tension.

7. The assembly according to claim 5, wherein the distal retaining member is formed from graphite.

8. The assembly according to claim 1, further including wafer-contacting pins coupled to distal ends of the first and second arms, the pins being formed from silicon.

9. The assembly according to claim 8, further including a coating on at least a portion of the wafer-contacting pins, the coating being formed from titanium nitride.

10. The assembly according to claim 1, wherein the first arm is rotatable about a first axis defined by a bearing in the at least one main structural member.

11. The assembly according to claim 1, wherein the first arm includes a transverse member configured to span a defined distance along an edge of a wafer, the transverse member having first and second portions for holding the wafer.

12. The assembly according to claim 11, wherein the first arm further includes a support member generally perpendicular to the transverse member.

13. The assembly according to claim 12, wherein the first arm is secured to the at least one main structural member via a conductive distal retaining member having a first end engaged to the support member and a second end engaged to the at least one main structural member.

14. The assembly according to claim 12, wherein the first arm is rotatable about a first axis generally parallel to the at least one main structural member and further including an elongate first bearing member generally concentric with the first axis for allowing the first arm to rotate with respect to the at least one main structural member, the first bearing member extending through a bore in the support member of the first arm.

15. The assembly according to claim 14, wherein the at least one main structural member comprises spaced apart first and second main structural members and the assembly further includes first and second sleeve members affixed to respective ones of the first and second main structural members for receiving ends of the first bearing member to reduce chipping of the first arm and the at least one main structural member as the first arm rotates.

16. The assembly according to claim 15, wherein the sleeves are formed from an insulative material and the assembly further includes a graphite distal retaining member coupled to the first and second main structural members and to the first arm.

17. The assembly according to claim 1, wherein the at least one main structural member includes opposed first and second main structural members.

18. The assembly according to claim 17, further including first and second cross members each extending from the first main structural member to the second main structural member, the first and second cross members being engaged with a support member extending perpendicularly from the transverse member of the first arm.

19. The assembly according to claim 18, further including a graphite distal retaining member having a first end coupled to the first and second main structural members and a second end mated with an end of the support member for securing the first arm to the first and second main structural members such that the second cross member is a fulcrum for the support member.

20. The assembly according to claim 17, wherein the first arm is rotatable about a first axis generally parallel to the first and second main-structural member and further including an elongate first bearing member generally aligned with the first axis for allowing the first arm to rotate with respect to the main structural members and an elongate second bearing coupled to the first and second main structural members and to the second arm, the second bearing member being generally aligned with the second axis for allowing the second arm to pivot with respect to the first and second main structural members between wafer-hold and wafer-release positions.

21. The assembly according to claim 17, further including a graphite intermediate retaining member engaged to the first and second main structural members.

22. The assembly according to claim 21, wherein the intermediate retaining member includes opposed U-shaped outer members coupled by a spring member under tension.

23. The assembly according to claim 17, further including a graphite proximal retaining member engaged to a proximal region of the first and second main structural members.

24. The assembly according to claim 1, further including a shield matable to the assembly for blocking the ion beam from striking a portion of the assembly.

25. The assembly according to claim 1, further including a shield matable to the assembly such that the ion beam strikes only the wafer and wafer-contacting pins secured to ends of the first and second arms.

26. The assembly according to claim 1, further including a silicon shield matable to the assembly for blocking the ion beam.

27. An ion implantation system, comprising:
   a wafer holder assembly including
      at least one main structural member;
      a first arm joined to the at least one main structural member; and
      a second arm pivotably coupled to the at least one main structural member, the second arm being biased towards a wafer-holding position by a bias member,
   wherein the wafer holder assembly provides a conductive path from a wafer to the wafer holder assembly to inhibit electrical charging of a wafer as the wafer is subjected to an ion beam.

* * * * *